United States Patent
Benzing et al.

Patent Number: 5,976,757
Date of Patent: Nov. 2, 1999

[54] DEVELOPMENT MATERIAL AND PROCESS FOR THE PRODUCTION OF A NEGATIVE COLOR PROOF, AND PROCESS FOR THE PRODUCTION OF BOTH A POSITIVE AND NEGATIVE COLOR PROOF ON A SINGLE IMAGE-RECEIVING MATERIAL

[75] Inventors: Martin Benzing, Biebelnheim; Dieter Mohr, Appenheim; Jürgen Mertes, Gau-Algesheim; Holger Schembs, Mainz; Andrea Travers-Hemmer, Oestrich-Winkel; Daniela Clausen, Wiesbaden; Karola Kaufhold, Elsheim, all of Germany

[73] Assignee: Agfa Gevaert, Mortsel, Belgium

[21] Appl. No.: 09/111,704

[22] Filed: Jul. 8, 1998

[30] Foreign Application Priority Data

Jul. 8, 1997 [EP] European Pat. Off. ............. 97202089

[51] Int. Cl.⁶ .............................. G03C 3/00; G03C 11/12
[52] U.S. Cl. ......................... 430/252; 430/253; 430/257
[58] Field of Search ................................. 430/252, 253, 430/257

[56] References Cited

U.S. PATENT DOCUMENTS 3,481,736  12/1969  Ruff et al. ................................ 96/28
3,607,264  9/1971   Celeste et al. ........................... 96/28
4,081,282  3/1978   Merrill et al. ........................... 96/77
4,366,223  12/1982  Larson .................................. 430/143
4,895,787  1/1990   Platzer ................................. 430/253
4,923,780  5/1990   Taylor, Jr. ............................. 430/257
5,049,476  9/1991   Platzer ................................. 430/253
5,087,549  2/1992   Peiffer ................................ 430/253
5,108,868  4/1992   Platzer ................................. 430/143
5,300,399  4/1994   Wilczak ............................... 430/253
5,436,112  7/1995   Hsieh et al. .......................... 430/253
5,534,384  7/1996   Platzer et al. ........................ 430/260
5,660,968  8/1997   Wilczak et al. ........................ 430/253
5,824,448  10/1998  Liu et al. ............................. 430/143

FOREIGN PATENT DOCUMENTS 0 437 343  7/1991   European Pat. Off. .
0 568 744  11/1993  European Pat. Off. .
0 601 760  6/1994   European Pat. Off. .
0 701 173  3/1996   European Pat. Off. .
96/10214   4/1996   WIPO .

*Primary Examiner*—Janet Baxter
*Assistant Examiner*—Yvette M. Clarke
*Attorney, Agent, or Firm*—Foley & Lardner

[57] ABSTRACT

The present invention relates to a development material by means of a latent, colored image, obtained by laminating another, photopolymerizable material colored in a primary color onto an image-receiving material, peeling-off the film support and exposing the material under the associated negative color separation film, can be developed by laminating the development material onto the latent image and then peeling-off the development material together with the non-image areas. The invention also relates to a process for the production of a color proof using this development material in combination with photopolymerizable materials in the various primary colors.

20 Claims, No Drawings

DEVELOPMENT MATERIAL AND PROCESS FOR THE PRODUCTION OF A NEGATIVE COLOR PROOF, AND PROCESS FOR THE PRODUCTION OF BOTH A POSITIVE AND NEGATIVE COLOR PROOF ON A SINGLE IMAGE-RECEIVING MATERIAL

FIELD OF THE INVENTION

1. Technical Field of the Invention

The invention relates to the field of production of colour proofs during preparation for printing.

2. Prior Art

Peel-apart processes described hitherto which utilize only a single light source generally produce either a positive or negative proof.

A system in which both a positive and a negative proof can be produced, even on the same receiving material, is disclosed in U.S. Pat. No. 4,923,780, where solubility differentiation, before development by peeling off the film support, is achieved with the aid of actinic light of different wavelengths in two successive exposures.

The following applications describe peel-apart processes which allow negative film masters to be processed.

In EP-A 0 365 362 (=U.S. Pat. No. 5,108,868), DE-A 29 34 052 and U.S. Pat. No. 4,081,282, the finished images are transferred to an image-receiving material after peel-apart development. This requires at least one aligned lamination step, which can easily result in misalignments.

In U.S. Pat. No. 5,300,399, WO96/10216, EP-A 0 643 332, U.S. Pat. Nos. 5,436,112, 3,481,736, WO 92/15920 and EP-A 0 385 466, the colour materials, after lamination, are exposed under a negative film master through the film support of the photosensitive layer, and the image is then developed by peeling off the film support. Alternatively, the materials can first be exposed and then laminated and developed. The processing of positive film masters is not possible in this process. Since the exposure must take place through a film, the resolving power of the systems is restricted for physical reasons.

GB-A 2,213,950 and EP-A 0 323 191 use a process similar to that just described, but only parts of the coloured layer are transferred in each of the image areas.

U.S. Pat. Nos. 5,087,549 and 3,607,264 also describe peel-apart development, but here exposure and lamination give tacky and non-tacky areas, on which an image is only then formed by a toning step.

EP-A 0 514 186 discloses a process in which a material consisting of a release-coated, transparent film support, a coloured, photosensitive layer applied thereto and a thermoplastic adhesive layer located thereon is used to produce a colour proof. To do this, the material is laminated, by means of its adhesive layer, onto an image-receiving material and exposed under a negative colour separation, and the film support is then peeled off without producing imagewise differentiation. Another transparent film support, but with a coating of adhesion promoter, is then laminated on, the entire image is flood-exposed, and this film support is peeled off together with the non-image areas. All the steps are then repeated using materials in the other primary colours.

The result is a process for the production of a multicolour image which, although similar to the novel process, additionally requires flood exposure in addition to the imagewise exposure, which, for the user, means an additional working step and thus loss of time in production of the proof.

In EP-A 0 514 186, the image-generating mechanism itself is of an entirely different nature to the image development in the novel development material.

The object of the invention was to provide a development material and a colour proofing process of the generic type described above by means of which photopolymerizable materials which are suitable for the processing of positive film masters can also be used to process negative film masters, or even positive and negative film masters together on a single image-receiving material, and by means of which, in the production of colour proofs from negative film masters, better resolution can be achieved than usual in the peel-apart process, the development material being designed so that this is possible without an additional flood-exposure step.

DETAILED DESCRIPTION OF THE INVENTION

The novel process uses a light source whose emission spectrum need not be modifiable, and a photopolymerizable material consisting of A) a transparent, flexible film support made of plastic,
B) a photopolymerizable layer which comprises
   B1) a polymeric binder,
   B2) a free-radical-polymerizable compound,
   B3) a compound which is capable of initiating the polymerization of (B2) on exposure to actinic light, and
   B4) a dye or coloured pigment in a primary colour of multicolour printing, and
C) a thermoplastic adhesive layer on the photo sensitive layer, as follows:

Negative colour proofs are produced by laminating a photopolymerizable material coloured in a primary colour onto an image-receiving material, peeling off the film support, exposing the material under the associated negative colour separation film, laminating on a development material according to the invention, developing the image by peeling off the development material together with the non-image areas, and repeating the same steps using a photopolymerizable material in at least one other primary colour and at least one further development material.

Positive and negative colour proofs are produced together on a single receiving material by laminating a photopolymerizble material coloured in a primary colour onto an image-receiving material, exposing the material under the associated positive colour separation film (with the areas where negative colour proofs are to be formed covered in a light-opaque manner), developing the positive images by peeling off the film support from the photopolymerizable layer together with the non-image areas of the positive images, exposing the areas where negative colour proofs are to be formed under the associated negative colour separation film (with the areas where positive images are located uncovered and likewise exposed), laminating on the development material according to the invention, developing the negative images by peeling off the development material together with the non-image areas of the negative images, and repeating the same steps using a photopolymerizable material in at least one other primary colour and at least one further development material.

Since, in the novel process for the production of negative colour proofs, the colour separation films come into direct contact with the photopolymerizable layer, radiation cannot leak beneath the films, giving much better resolution of the negative colour proofs compared with other peel-apart processes.

If it is possible to dispense with the advantage of simultaneously also producing positive colour proofs in addition to negative colour proofs, a film support which has been pretreated with a release agent can be used in the production of the photopolymerizable material, whereas otherwise a film support which has been pretreated with an adhesion promoter should preferably be used.

This then gives the option of using a different procedure in the novel process for the production of negative colour proofs by laminating a photopolymerizable material coloured in a primary colour onto an image-receiving material, exposing the material under the associated negative colour separation film, peeling off the film support from the photopolymerizable layer without any imagewise differentiation taking place, laminating on a novel development material, developing the image by peeling off the development material together with the non-image areas, and repeating the same steps using a photopolymerizable material in at least one other primary colour and at least one further development material. However, the advantage of better resolution than usual in peel-apart processes is then lost.

The photopolymerizable materials employed in the novel processes have already been disclosed in U.S. Pat. Nos. 4,895,787, 5,049,476 and EP Application No. 96 201 083.1.

The adhesive layer of the photopolymerizable material to be employed can contain a colourless, transparent or white pigment which has a particle size in a certain range and is present in such an amount within a certain range that it is not visible in a transparent polymer layer.

The pigment can be of an inorganic or organic nature and must be insoluble in the coating solvent used for the adhesive layer. Since the solvent employed is preferably water or a mixture consisting predominantly of water, a multiplicity of water-insoluble substances are suitable as pigments. Examples are silicic acids, aluminium oxides, silicates, phosphates, borates and other inorganic salts or oxides. Also suitable are organic polymers, such as polyethylene, polypropylene, polyester, polycarbonates, phenolic resins and other water-insoluble substances. In general, inorganic pigments are preferred.

The pigments should be readily dispersible in the usually aqueous solutions employed for the coating. Silicic acid pigments have proven particularly successful for this purpose.

The adhesive layer is applied directly to the photopolymerizable layer from a solvent or solvent mixture which does not dissolve this layer, and is dried. Suitable solvents which do not dissolve the coloured layer are water or a mixture predominantly consisting of water, and saturated hydrocarbons. Many polymers can be applied from aqueous dispersion; however, application from solution is preferred. Suitable for this purpose are, for example, salts of polymers containing acid groups, for example carboxyl groups. A preferred example is an aqueous-alkaline solution of a vinyl acetate-crotonic acid copolymer (®Mowilith Ct5). Other suitable polymers are polyvinyl acetate or polyacrylate dispersions. The polymer should have a softening point in the range from 40 to 200° C., preferably from 60 to 120° C., and should preferably have a $T_g$ value in the range from 20 to 60° C. In addition to the thermoplastic polymer, the adhesive layer may also contain plasticizers, residue solvents, surface levellers, lubricants, antistatics, optical brighteners and/or UV absorbers. Its layer weight in the dry state is normally from 1 to 30 g/m$^2$, preferably from 3 to 15 g/m$^2$. Suitable adhesive layers are also described in U.S. Pat. No. 4,895,787 and EP-A 525 624.

The photopolymerizable layer of this suitable material comprises, as essential constituents, a polymeric binder, a free-radical-polymerizable compound, a photoinitiator and a dye or coloured pigment in a primary colour of multicolour printing. Examples of photopolymerizable layers having this general composition are described in U.S. Pat. No. 4,895, 787, which is incorporated herein by way of reference.

Suitable photoinitiators are a wide variety of compounds or compound combinations which are known for this purpose. Examples are benzoin ethers, benzil ketals, polycyclic quinones, benzophenone derivatives, triarylimidazolyl dimers, photosensitive trihalomethyl compounds, for example trichloromethyl-s-triazines. Preference is given to 2,3-bisarylquinoxalines, as described in U.S. Pat. No. 3,765, 898, and 2-aryl-4,6-bistrichloromethyl-s-triazines. The amount of photoinitiator or photoinitiator combination is generally between 1 and 25% by weight, preferably between 5 and 15% by weight.

The polymeric binder is intended to give the layer homogeneity and strength. Suitable binders are styrene-maleic anhydride and styrene-maleic monoester copolymers, acrylate polymers and copolymers, polyamides, polyvinylpyrrolidones, cellulose derivatives, such as cellulose esters and ethers, phenolic resins, polyvinyl esters, polyvinyl acetals, for example polyvinylbutyral, -propional or -formal. The proportion of binder is generally from 15 to 70% by weight, preferably from 20 to 50% by weight, based on the weight of the solid layer.

The polymerizable compound contains at least one, preferably at least two, terminal free-radical-polymerizable double bonds and is not gaseous at atmospheric pressure and temperatures below 100° C. Preference is given to esters and amides of acrylic and methacrylic acids. Esters with polyhydric alcohols are particularly advantageous. Examples are di-, tri-, tetra- and polyethylene glycol di(meth)acrylate, the di(meth)acrylates of oligo- and polypropylene glycols, 1,4-butanediol di(meth)acrylate, trimethylolpropane and trimethylolethane di- and tri(meth)acrylate, pentaerythritol tri- and tetraacrylate or -methacrylate, dipentaerythritol tetra-, penta- and hexa(meth)acrylate. The proportion of polymerizable compound is generally from 15 to 70% by weight, preferably from 20 to 60% by weight.

In the preferred use of the material for colour proofing in multicolour printing, the dyes or coloured pigments are selected so that they conform to the primary colours of multicolour printing, namely cyan, magenta, yellow and black. Pigments are generally preferred. Examples are Permanent Yellow G (C.I. 21 095), Permanent Yellow GR (C.I. 21 100), Permanent Yellow DHG (C.I. 21 090), Permanent Ruby L6B (C.I. 15 850 : 1), Permanent Pink F3B (C.I. 12 433), ®Hostaperm Pink E (C.I. 73 915), ®Hostaperm Red-Violet ER (C.I. 46 500), Permanent Carmine FBB (C.I. 12 485), ®Hostaperm Blue B2G (C.I. 74 160), ®Hostaperm Blue A2R (C.I. 74 160) and ®Printex 25 (carbon black). The pigments can, if desired, be blended in order to achieve the desired hue. The inorganic or organic pigments are generally dispersed or suspended in a suitable solvent together with some of the binder. The mean particle size is generally below 1 $\mu$m.

The proportion of dye or pigment is generally from 8 to 40% by weight, preferably from 12 to 30% by weight.

The photopolymerizable layer can, if desired, contain further constituents, such as hydrogen donors, polymerization inhibitors, plasticizers, residual solvents, surfactants, surface levellers, lubricants, antistatics, inert fillers, optical brighteners and/or UV absorbers. It generally has a layer weight of from 0.2 to 5 g/m$^2$, preferably from 0.3 to 3 g/m$^2$.

Suitable film supports are transparent, flexible, dimensionally stable films made from plastics, for example polyesters, polycarbonates, etc. Particular preference is given to polyester films, in particular biaxially stretched and heat-set films, for example made from polyethylene terephthalate. These should remain dimensionally stable at the requisite lamination temperatures, i.e. of from about 60 to 150° C. Their thickness is generally from 10 to 200 µm, preferably from 25 to 80 µm. The film support can have a smooth or rough or matt surface, preferably a smooth surface.

In order to be able to carry out the novel process in which positive colour proofs are produced alongside negative colour proofs, it is advantageous for the film support of the photopolymerizable materials to have been pretreated on one or both sides with an adhesion promoter.

If the process for the production of negative colour proofs is now carried out, the film support of the photopolymerizable materials can also have been pretreated with a release agent, which is particularly advantageous if the exposure is to take place through the film.

In order to carry out the novel processes, the photosensitive, photopolymerizable material described above is laminated, by means of the adhesive layer, onto an image-receiving material. This can consist of plastic, plastic-coated special paper or normal printing paper. Other white or, if desired, non-white receiving materials can likewise be used. A printing paper which is dimensionally stable under lamination conditions is usually preferred, since it gives rise to a visual impression which comes very close to the later print. The lamination is advantageously carried out under pressure and at elevated temperature in a device provided for this purpose. The lamination temperature is usually in the range from 60 to 150° C., preferably between 80 and 130° C.

Under similar or even identical lamination conditions, the novel development material is laminated on after the film support has been peeled off and image formation has taken place under a negative colour separation film (in an embodiment with a film support which has been pretreated with a release agent, the exposure can take place first, and the film support then peeled off), and the image is then developed by peeling off this development material together with the non-image areas.

The novel development material consists of
a) a transparent, flexible film support made of plastic, and
b) a thermoplastic layer which comprises
   b1) a thermally activatable, polymeric binder, and optionally
   b2) various additives, such as pigments, auxiliaries, thermal initiators and polymerizable compounds.

Alternatively, the novel development material consists of
a) a transparent, flexible film support made of plastic, and
b) a thermoplastic layer which comprises
   b1.1) a polymeric binder and
   b1.2) a thermally activatable substance, and optionally
   b2) various additives, such as pigments, auxiliaries, thermal initiators and polymerizable compounds.

The polymeric binder in the thermoplastic layer is intended to give the layer homogeneity and strength without adversely affecting the adhesion or crosslinking formed during the lamination between the development material layer and the unexposed areas of the photopolymer layer of the photopolymerizable material. In a thermally activatable embodiment, it is intended to produce precisely this adhesion, although it must be ensured that no adhesion is produced in the exposed areas of the photopolymer layer of the photopolymerizable material.

Suitable polymeric binders are styrene-maleic anhydride and styrene-maleic monoester copolymers, acrylate polymers and copolymers, polyamides, polyvinylpyrrolidones, cellulose derivatives, such as cellulose esters and ethers, phenolic resins, polyvinyl esters, polyvinylacetals, for example polyvinylbutyral,-propional or -formal. The proportion of binder is generally from 2 to 98% by weight, preferably from 20 to 80% by weight, particularly preferably from 60 to 75% by weight, based on the weight of the solid layer.

Suitable thermally activatable polymeric binders and thermally activatable substances are polyacrylates (including polyester acrylates, polyether acrylates, polyester urethane acrylates and epoxy acrylates which also contain polymerizable double bonds), polymethacrylates, polyvinyl acetates, vinyl acetate-crotonic acid copolymers, and vinylpyrrolidone-vinyl acetate copolymers. The proportion by weight of these compounds corresponds, when used as thermally activatable polymeric binders, to the above-described proportion of polymeric binder. If the compounds are added to a polymeric binder as thermally activatable substances, their proportion by weight is from 1 to 50%, preferably from 2 to 30%, particularly preferably from 5 to 20%, based on the weight of the solid layer.

If desired, the layer can contain further, property-improving additives as constituents. These mainly serve to modify the adhesion or crosslinking properties of the layer containing the photopolymer layer of the photopolymerizable material.

These include, in particular, inorganic and organic pigments. Colourless, white or coloured pigments can be employed. The pigments are generally dispersed or suspended in a suitable solvent together with some of the binder. The mean particle size is between 0.01 µm and 6 µm, particularly preferably below 1 µm. The proportion of pigment is from 2 to 50% by weight, preferably from 10 to 30% by weight.

Polymerizable compounds as additives can also have a positive effect on the layer properties. Suitable here are acrylate monomers or methacrylate monomers. They are added to the layer in amounts of from 0.5 to 10%.

Thermally activatable initiators as additives can likewise have a positive effect. Suitable here are in particular trichloromethyltriazine derivatives, but also other thermally decomposable free-radical formers. The proportions are generally between 1 and 15%, based on the weight of the solid layer.

The layer can furthermore contain polymerization inhibitors, plasticizers, residual solvents, surfactants, surface levellers, lubricants, antistatics, inert fillers, optical brighteners and UV absorbers. It generally has a layer weight of from 0.1 to 5 g/m$^2$, preferably from 0.2 to 2 g/m$^2$.

Suitable film supports are transparent, flexible, dimensionally stable films made from plastics, for example polyesters, polycarbonates, etc. Particular preference is given to polyester films, in particular biaxially stretched and heat-set films, for example made from polyethylene terephthalate. These should remain dimensionally stable at the requisite lamination temperatures, i.e. of from about 60 to 150° C. Their thickness is generally from 10 to 200 µm, preferably from 25 to 80 µm. The film support can be pretreated on one or both sides with an adhesion promoter and, if necessary, also with an antistatic and can have a smooth or rough/matt surface, preferably a smooth surface.

The finished multicolour image generally has a glossy surface. If desired, the surface can also be rendered matt by, for example, laminating a film having a rough surface onto the glossy layer surface and peeling it off again. The surface of the finished proof can also be protected against scratching or adhesion at elevated temperatures by means of a protective layer.

The invention is illustrated in greater detail by means of the examples below without being restricted thereto. Unless otherwise stated, all percentages and mixing ratios are by weight.

EXAMPLES

Example 1

A) Production of the Photosensitive, Photopolymerizable Materials

The following solutions were applied to biaxially stretched and heat-set polyester films (®Melinex 505) with a thickness of 50 μm which have been pretreated with an adhesion promoter on both sides:

|  | Cyan | Magenta | Yellow | Black |
|---|---|---|---|---|
| Dipentaerythritol pentaacrylate | 19.9 | 25.0 | 21.6 | 19.9 |
| 2,4-Bistrichloromethyl-6-biphenylyl-s-triazine | 5.1 | 6.1 | 5.4 | 5.3 |
| Polyvinyl formal (® Formvar 12/85) | 16.3 | 23.0 | 18.4 | 14.2 |
| Copolymer of a polyether-modified polysiloxane containing 80% by weight of ethylene oxide units and 20% by weight of propylene oxide units in the polyether component, viscosity 240 cSt/25° C., MW about 6500 | 0.2 | 0.2 | 0.2 | 0.2 |
| ® Hostaperm Blue B2G (C.I. 74 160) | 9.7 | | | |
| Permanent Red FBB (C.I. 12 485) | | 12.9 | | |
| Permanent Yellow GR (C.I. 21 100) | | | 8.6 | |
| Carbon black (® Printex 25) | | | | 13.6 |
| Tetrahydrofuran | 398.6 | 363.9 | 382.4 | 378.8 |
| 4-Hydroxy-4-methyl-2-pentanone | 113.9 | 121.3 | 124.3 | 123.1 |
| 1-Methoxy-2-propanol | 360.6 | 326.5 | 353.7 | 331.5 |
| γ-Butyrolactone | 75.9 | 121.3 | 86.0 | 113.6 |

The pigments were dispersed with some of the binder and the γ-butyrolactone. The mean particle size was below 200 nm.

The coated films were dried in a drying tunnel at temperatures of up to 110° C. The layer weight was between 0.6 and 0.8 g/m².

The following adhesive-layer solution was applied to the dry photopolymerizable layer:

| Vinyl acetate-crotonic acid copolymer 95:5 | 50.0 parts by weight |
|---|---|
| Pyrogenic silicic acid (mean particle size 40 nm) | 0.16 part by weight |
| Water | 252 parts by weight |
| Ethanol | 24.0 parts by weight |
| Ammonia water, 25% | 5.0 parts by weight |

The coated films were dried in a drying tunnel at temperatures of 100° C. The layer weight was 6.5 g/m².

B) Production of the Novel Development Material

The following solution was applied to a pretreated, biaxially stretched and heat-set polyester film (®Melinex 456) with a thickness of 50 μm:

| Polyvinylformal (® Formvar 12/85) | 1.92 |
|---|---|
| ® Hostaperm Blue B2G (C.I. 74 160) | 0.43 |
| Carbon black (® Printex 25) | 0.43 |
| Epoxy acrylate (® Ebecryl 600) | 0.70 |
| Tetrahydrofuran | 53.69 |
| 1-Methoxy-2-propanol | 35.79 |
| γ-Butyrolactone | 7.04 |

The pigments were dispersed with some of the binder and the γ-butyrolactone. The mean particle size was below 200 nm.

The coated films were dried in a drying tunnel at temperatures of up to 110° C. The layer weight was between 0.4 and 0.6 g/m².

This novel development material (production described under B) was used, with the aid of the photosensitive, photopolymerizable colour materials (production described under A), to produce negative colour proofs by the following process:

A photopolymerizable material coloured in a primary colour was laminated onto an image-receiving material, the film support was peeled off, the material was exposed under the associated negative colour separation film, a development material according to the invention was laminated on, and the image was developed by peeling off the development material together with the non-image areas, and the same steps were repeated using photopolymerizable materials in other primary colours and in each case a further development material, so that the 4-colour proof was complete.

Example 2

The novel development material from Example 1 (production described under Example 1, Part B) was used to produce positive and negative colour proofs simultaneously on a receiving material with the aid of the photosensitive, photopolymerizable colour materials from Example 1 (production described under Example 1, Part A) by the following process:

A photopolymerizable material coloured in a primary colour was laminated onto an image-receiving material, exposed under the associated positive colour separation film (with the areas where the negative colour proof was to be formed covered in an opaque manner), the positive image was developed by peeling off the film support of the photopolymerizable layer together with the non-image areas of the positive image, the areas where the negative colour proof was to be formed were exposed under the associated negative colour separation film (with the areas where the positive image was located uncovered and likewise exposed), a development material according to the invention was laminated on, the negative image was developed by peeling off the development material together with the non-image areas of the negative image, and the same steps were repeated using photopolymerizable materials in other primary colours and in each case with a further development material, so that the 4-colour proof was complete.

Example 3

Biaxially stretched and heat-set polyester films with a thickness of 63 μm which had been pretreated with a release agent on one side were used to produce photosensitive, photopolymerizable materials analogously to Example 1, Part A.

Together with the novel development material (production described under Example 1, Part B), negative colour proofs were produced by the following process:

A photopolymerizable material coloured in a primary colour was laminated onto an image-receiving material and exposed under the associated negative colour separation film, the film support was peeled off without imagewise differentiation taking place, a development material according to the invention was laminated on, the image was developed by peeling off the development material together with the non-image areas, and the same steps were repeated using photopolymerizable materials in other primary colours and in each case a further development material, so that the 4-colour proof was complete.

Examples 4–6

Colour proofs were produced analogously to the colour proofs produced in Examples 1–3 using a development material described below instead of the development material from Example 1, Part B.

The following solution was applied to a pretreated, biaxially stretched and heat-set polyester film (®Melinex 456) with a thickness of 50 μm:

| | |
|---|---|
| Polyvinylformal (® Formvar 12/85) | 2.37 |
| ® Hostaperm Blue B2G (C.I. 74 160) | 0.43 |
| Carbon black (® Printex 25) | 0.43 |
| Epoxy acrylate (® Ebecryl 600) | 0.25 |
| Tetrahydrofuran | 53.69 |
| 1-Methoxy-2-propanol | 35.79 |
| γ-Butyrolactone | 7.04 |

The pigments were dispersed with some of the binder and the γ-butyrolactone. The mean particle size was below 200 nm.

The coated films were dried in a drying tunnel at temperatures of up to 110° C. The layer weight was between 0.4 and 0.6 g/m².

In Examples 4–6, the exposure times required to form an image were shorter than in Examples 1–3.

Examples 7–9

Colour proofs were produced analogously to the colour proofs produced in Examples 1–3 using a development material described below instead of the development material from Example 1, Part B.

The following solution was applied to a pretreated, biaxially stretched and heat-set polyester film (®Melinex 456) with a thickness of 50 μm:

| | |
|---|---|
| Polyvinylformal (® Formvar 12/85) | 1.74 |
| ® Hostaperm Blue B2G (C.I. 74 160) | 0.43 |
| Carbon black (® Printex 25) | 0.43 |
| Epoxy acrylate (® Ebecryl 600) | 0.88 |
| Tetrahydrofuran | 53.69 |
| 1-Methoxy-2-propanol | 35.79 |
| γ-Butyrolactone | 7.04 |

The pigments were dispersed with some of the binder and the γ-butyrolactone. The mean particle size was below 200 nm.

The coated films were dried in a drying tunnel at temperatures of up to 110° C. The layer weight was between 0.4 and 0.6 g/m².

In Examples 7–9, the same results as in Examples 1–6 were achieved using a lower lamination temperature during lamination of the development film.

Examples 10–12

Colour proofs were produced analogously to the colour proofs produced in Examples 1–3 using a development material described below instead of the development material from Example 1, Part B.

The following solution was applied to a pretreated, biaxially stretched and heat-set polyester film (®Melinex 456) with a thickness of 50 μm:

| | |
|---|---|
| Polyvinylformal (® Formvar 12/85) | 2.09 |
| Permanent Yellow GR (C.I. 21 100) | 0.43 |
| Carbon black (® Printex 25) | 0.43 |
| Polyether acrylate (® Viaktin VTE 6154) | 0.53 |
| Tetrahydrofuran | 53.69 |
| 1-Methoxy-2-propanol | 35.79 |
| γ-Butyrolactone | 7.04 |

The pigments were dispersed with some of the binder and the γ-butyrolactone. The mean particle size was below 200 nm.

The coated films were dried in a drying tunnel at temperatures of up to 110° C. The layer weight was between 0.4 and 0.6 g/m².

The development materials exhibited a similar behaviour to the materials from Examples 1–6.

Examples 13–15

Colour proofs were produced analogously to the colour proofs produced in Examples 1–3 using a development material described below instead of the development material from Example 1, Part B.

The following solution was applied to a pretreated, biaxially stretched and heat-set polyester film (®Melinex 456) with a thickness of 50 μm:

| | |
|---|---|
| Polyvinylformal (® Formvar 12/85) | 2.09 |
| Permanent Yellow GR (C.I. 21 100) | 0.43 |
| Carbon black (® Printex 25) | 0.43 |
| Polyester acrylate (® Viaktin VTE 5969) | 0.53 |
| Tetrahydrofuran | 53.69 |
| 1-Methoxy-2-propanol | 35.79 |
| γ-Butyrolactone | 7.04 |

The pigments were dispersed with some of the binder and the γ-butyrolactone. The mean particle size was below 200 nm.

The coated films were dried in a drying tunnel at temperatures of up to 110° C. The layer weight was between 0.4 and 0.6 g/m².

The development materials exhibited a similar behaviour to the materials from Examples 10–12.

Examples 16–18

Colour proofs were produced analogously to the colour proofs produced in Examples 1–3 using a development material described below instead of the development material from Example 1, Part B.

The following solution was applied to a pretreated, biaxially stretched and heat-set polyester film (®Melinex 456) with a thickness of 50 μm:

| | |
|---|---|
| Polyvinylformal (® Formvar 12/85) | 0.86 |
| Permanent Yellow GR (C.I. 21 100) | 0.43 |
| Carbon black (® Printex 25) | 0.43 |
| Vinyl acetate/crotonic acid copolymer (® Mowilith CT5) | 1.76 |
| Tetrahydrofuran | 53.69 |
| 1-Methoxy-2-propanol | 35.79 |
| γ-Butyrolactone | 7.04 |

The pigments were dispersed with some of the binder and the γ-butyrolactone. The mean particle size was below 200 nm.

The coated films were dried in a drying tunnel at temperatures of up to 110° C. The layer weight was between 0.4 and 0.6 g/m².

Using these development materials, a matt surface was achieved.

Examples 19–21

Colour proofs were produced analogously to the colour proofs produced in Examples 1–3 using a development material described below instead of the development material from Example 1, Part B.

The following solution was applied to a pretreated, biaxially stretched and heat-set polyester film (®Melinex 456) with a thickness of 50 μm:

| | |
|---|---|
| Polyvinylformal (® Formvar 12/85) | 2.91 |
| Vinyl acetate/crotonic acid copolymer (® Mowilith CT5) | 5.83 |
| Tetrahydrofuran | 54.76 |
| 1-Methoxy-2-propanol | 36.50 |

The coated films were dried in a drying tunnel at temperatures of up to 110° C. The layer weight was between 0.4 and 0.6 g/m².

Although the development materials worked similarly to those known from Examples 16–18, adhesion occurred during lamination, which resulted in flaws in the image produced.

Examples 22–24

Colour proofs were produced analogously to the colour proofs produced in Examples 1–3 using a development material described below instead of the development material from Example 1, Part B.

The following solution was applied to a pretreated, biaxially stretched and heat-set polyester film (®Melinex 456) with a thickness of 50 μm:

| | |
|---|---|
| Polyvinylformal (® Formvar 12/85) | 1.78 |
| Permanent Red FBB (C.I. 12 485) | 1.56 |
| Polyester acrylate (® Viaktin VTE 5979) | 2.74 |
| 2,4-Bistrichloromethyl-6-biphenylyl-s-triazine | 0.62 |
| Tetrahydrofuran | 50.01 |
| 1-Methoxy-2-propanol | 30.67 |
| γ-Butyrolactone | 12.62 |

The pigments were dispersed with some of the binder and the γ-butyrolactone. The mean particle size was below 200 nm.

The coated films were dried in a drying tunnel at temperatures of up to 110° C. The layer weight was between 0.4 and 0.6 g/m².

These development materials were processable at an even lower lamination temperature than the materials from Examples 7–9.

We claim:

1. A process for the production of a positive and negative color proof together on a receiving material, said process comprising:
    (1) laminating a photopolymerizable material, which comprises,
       A) a transparent flexible plastic film support,
       B) a photopolymerizable layer which comprises
          B1) a polymeric binder,
          B2) a free-radical-polymerizable compound,
          B3) a compound which is capable of initiating the polymerization of B2) on exposure to actinic light, and
          B4) a dye or colored pigment in a primary color of multicolor printing, and
       C) a thermoplastic adhesive layer, onto an image receiving material,
    (2) exposing the laminated material through a positive color separation film, with the areas where the negative color proof is to be formed covered in an opaque manner,
    (3) developing the positive image by peeling off the film support from the photopolymerizable layer together with the non-image areas of the positive image,
    (4) exposing the areas where the negative color proof is to be formed under the associated negative color separation film with simultaneous exposure of the finished positive image,
    (5) laminating on a development material comprising a support and a thermoplastic layer, wherein said thermoplastic layer comprises either (i) a thermally activatable polymeric binder, or (ii) a polymeric binder, and a thermally activatable substance,
    (6) developing the negative image by peeling off said development material together with the non-image areas of the negative image, and
    (7) repeating 1–6 above using a photopolymerizable material colored in at least one other primary color in combination with a further development material.

2. The process according to claim 1, wherein the thermoplastic layer has a dry weight of from 0.1 to 5 g/m².

3. The process according to claim 2, wherein the thermoplastic layer has a dry weight of from 0.2 to 2 g/m².

4. The process according to claim 1, wherein the thermally activatable, polymeric binder in the thermoplastic layer is a polyacrylate, polymethacrylate, polyvinyl acetate, vinyl acetate-crotonic acid copolymer or vinylpyrrolidone-vinyl acetate copolymer.

5. The process according to claim 4, wherein the thermally activatable, polymeric binder in the thermoplastic layer is present in a proportion of from 2 to 98% by weight, based on the weight of the solid layer.

6. The process according to claim 5, wherein the thermally activatable, polymeric binder is present in the thermoplastic layer in a proportion of from 20 to 80% by weight based on the weight of the solid layer.

7. The process according to claim 5, wherein the thermally activatable, polymeric binder is present in the thermoplastic layer in a proportion of from 60 to 75% by weight based on the weight of the solid layer.

8. The process according to claim 1, wherein the thermally activatable, polymeric binder in the thermoplastic layer is a polyester acrylate, polyether acrylate, polyester urethane acrylate or epoxy acrylate and further contains polymerizable double bonds.

9. The process according to claim 1, wherein the polymeric binder in the thermoplastic layer is a styrene-maleic anhydride or styrene-maleic monoester copolymer, an acrylate polymer or copolymer, a polyamide, a polyvinylpyrrolidone, a cellulose derivative, a phenolic resin, a polyvinyl ester or a polyvinyl acetal resin,.

10. The process according to claim 9, wherein the polymeric binder in the thermoplastic layer is a cellulose derivative selected from the group consisting of cellulose ester and cellulose ether.

11. The process according to claim 9, wherein the polymeric binder in the thermoplastic layer is a polyvinyl ester or polyvinyl acetal resin selected from the group consisting of polyvinylbutyral resin, polyvinylpropional resin and polyvinylformal resin.

12. The process according to claim 9, wherein the polymeric binder is present in the thermoplastic layer in a proportion of from 2 to 98% by weight, based on the weight of the solid layer.

13. The process according to claim 12, wherein the thermally activatable, polymeric binder is present in the thermoplastic layer in a proportion of from 20 to 80% by weight based on the weight of the solid layer.

14. The process according to claim 12, wherein the thermally activatable, polymeric binder in the thermoplastic layer is present in a proportion of from 60 to 75% by weight based on the weight of the solid layer.

15. The process according to claim 9, wherein the thermally activatable substance present in the thermoplastic layer in addition to the polymeric binder is a polyacrylate, polymethacrylate, polyvinyl acetate, vinyl acetate-crotonic acid copolymer or vinylpyrrolidone-vinyl acetate copolymer.

16. The process according to claim 9, wherein the thermally activatable substance present in the thermoplastic layer in addition to the polymeric binder is a polyester acrylate, polyether acrylate, polyester urethane acrylate or epoxy acrylate and said thermally activatable substance further contains polymerizable double bonds.

17. The process according to claim 1, wherein the thermoplastic layer further comprises inorganic and/or organic pigments.

18. The process according to claim 1, wherein the thermoplastic layer further comprises at least one thermally activatable free-radical former.

19. The process according to claim 18, wherein at least one of the thermally activatable free-radical formers is a trichloromethyl-substituted triazine derivative.

20. A process for preparing a positive and negative image on the same image receiving material comprising developing the image via laminating onto a photopolymerizable material, which comprises, A) a transparent flexible plastic film support, B) a photopolymerizable layer which comprises
   B1) a polymeric binder,
   B2) a free-radical-polymerizable compound,
   B3) a compound which is capable of initiating the polymerization of B2) on exposure to actinic light, and
   B4) a dye or colored pigment in a primary color of multicolor printing, and C) a thermoplastic adhesive layer.

* * * * *